(12) United States Patent
Huang et al.

(10) Patent No.: US 12,364,023 B2
(45) Date of Patent: Jul. 15, 2025

(54) SEMICONDUCTOR DEVICES WITH IMPROVED LAYOUT TO INCREASE ELECTROSTATIC DISCHARGE PERFORMANCE

(71) Applicant: Taiwan Semiconductor Manufacturing Company, Ltd., Hsinchu (TW)

(72) Inventors: Hsiao-Ching Huang, New Taipei (TW); Hao-Hua Hsu, Taipei (TW); Sheng-Fu Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 457 days.

(21) Appl. No.: 17/831,717

(22) Filed: Jun. 3, 2022

(65) Prior Publication Data
US 2023/0395592 A1 Dec. 7, 2023

(51) Int. Cl.
*H10D 89/60* (2025.01)
*H02H 9/04* (2006.01)

(52) U.S. Cl.
CPC .......... *H10D 89/819* (2025.01); *H02H 9/046* (2013.01); *H10D 89/911* (2025.01)

(58) Field of Classification Search
CPC . H01L 27/0288; H01L 27/0928; H02H 9/046; H10D 89/819; H10D 89/911
See application file for complete search history.

(56) References Cited

U.S. PATENT DOCUMENTS

| | | | |
|---|---|---|---|
| 10,157,925 B1 * | 12/2018 | Kuo | H10D 84/0167 |
| 2017/0229575 A1 * | 8/2017 | Chu | H01L 29/0615 |
| 2022/0037309 A1 | 2/2022 | Gauthier, Jr. et al. | |

FOREIGN PATENT DOCUMENTS

TW    I582948 B    5/2017

* cited by examiner

*Primary Examiner* — Wasiul Haider
(74) *Attorney, Agent, or Firm* — Eschweiler & Potashnik, LLC

(57) ABSTRACT

Various embodiments of the present disclosure are directed towards an integrated circuit (IC) including a first semiconductor device and second semiconductor device disposed on a semiconductor substrate. The first semiconductor device comprises a first gate structure, a first source region, and a first drain region. The first source and drain regions are disposed in a first well region. The second semiconductor device comprises a second gate structure, a second source region, and a second drain region. The second source and drain regions are disposed in a second well region. The first and second well regions comprise a first doping type. The first well region is laterally offset from the second well region by a first distance. A third well region is disposed in the semiconductor substrate and laterally between the first and second well regions. The third well region comprises a second doping type opposite the first doping type.

20 Claims, 9 Drawing Sheets

US 12,364,023 B2

SEMICONDUCTOR DEVICES WITH IMPROVED LAYOUT TO INCREASE ELECTROSTATIC DISCHARGE PERFORMANCE

BACKGROUND

Modern day integrated circuits (ICs) comprise millions or billions of semiconductor devices on a semiconductor substrate (e.g., silicon). Electrostatic discharge (ESD) is a sudden release of electrostatic charge which can result in high electric fields and currents within an IC. ESD pulses can damage the semiconductor devices, for example by "blowing out" a gate dielectric of a transistor or by "melting" an active region of the device. If the semiconductor devices are damaged by an ESD pulse, the IC can be rendered less operable than desired, or can even be rendered inoperable altogether.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
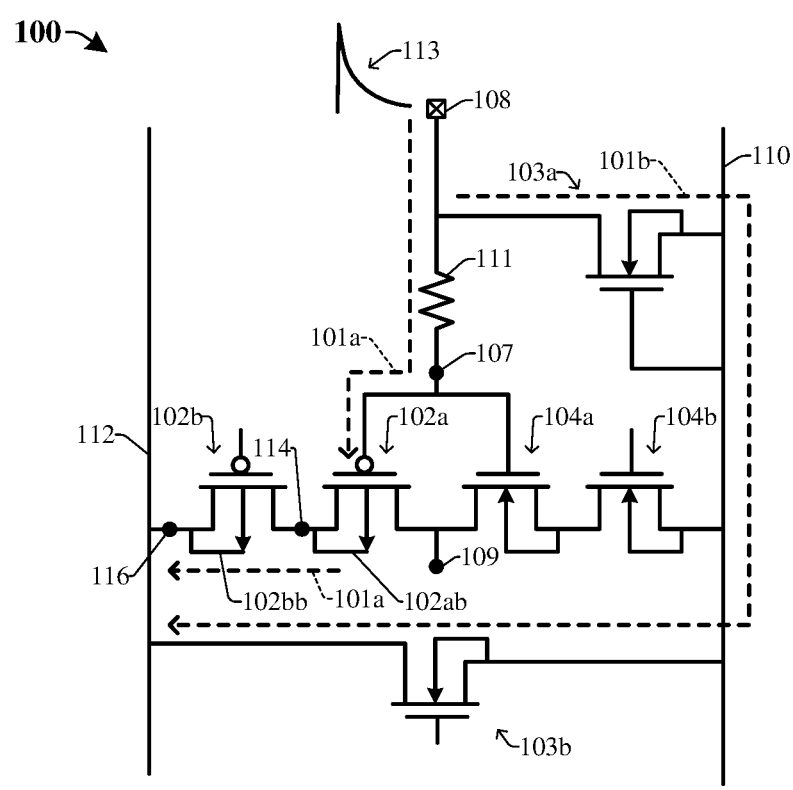
FIG. 1 illustrates a circuit diagram of some embodiments of an integrated circuit (IC) comprising a first plurality of semiconductor devices and a second plurality of semiconductor devices that having improved electrostatic discharge (ESD) performance.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits (ICs) may comprise a plurality of semiconductor devices configured as metal—oxide—semiconductor field-effect transistors (MOSFETs). The semiconductor devices respectively comprise a source region and a drain region disposed in a semiconductor substrate. Further, the semiconductor devices respectively comprise a gate stack, which comprises a gate electrode overlying a gate dielectric, disposed over the semiconductor substrate between the drain region and the source region.

In addition, the ICs comprise a plurality of input/output (I/O) structures (e.g., bond pads, solder bumps, etc.). The plurality of I/O structures are configured to provide electrical connections between an IC and its package (e.g., through-hole packages, surface mount packages, chip carrier packages, pin grid array packages, small outline packages, flat packages, chip-scale packages, ball grid array packages, etc.). In some embodiments, an I/O structure of the plurality of I/O structures is configured as an open-drain I/O structure (e.g., an open-drain output pad). In such embodiments, the IC comprises an open-drain buffer circuit. The open-drain buffer circuit comprises a first plurality of semiconductor devices configured to receive a control signal from the I/O structure and a plurality of electrostatic discharge (ESD) devices. Each of the first plurality of semiconductor devices and the plurality of ESD devices may be configured as a MOSFET. The first plurality of semiconductor devices comprises a first semiconductor device and a second semiconductor device coupled in series with one another. Generally, the first and second semiconductor devices are disposed within a single well region, such that the first and second semiconductor devices share a single body region that is directly electrically coupled to the source region of the second semiconductor device. The plurality of ESD devices comprises a first ESD device and second ESD device.

The open-drain buffer circuit is configured to provide an output to one or more other semiconductor devices of the IC (e.g., internal IC logic devices) based on the value of a control signal applied to a gate electrode of the first semiconductor device (e.g., applied from an external IC to the I/O structure). For example, the gate electrode of the first semiconductor device is coupled to the I/O structure, the drain of the first semiconductor device is coupled to an output node of the IC, the source of the first semiconductor device is coupled to the drain of the second semiconductor device, and the source of the second semiconductor device is coupled to a voltage rail. Depending on a value of the control signal applied to the I/O structure, the voltage at the output node of the IC will be high (e.g., a logical "1") or low (e.g., a logical "0").

One challenge with the IC is the susceptibility of the IC to be damaged by an electrostatic discharge (ESD) pulse. For example, if an ESD event occurs, the ESD pulse may catastrophically damage the IC (e.g., "blowing out" gate dielectrics, "melting" active regions, etc.). One commonly used model for characterizing the susceptibility of an IC to damage from an ESD pulse is the human-body model (HBM). For certain applications (e.g., HBM ESD class 2 devices), the IC must pass the HBM test at a predefined ESD pulse voltage (e.g., 2,000 V). The first and second ESD devices are configured to mitigate damage to the first and second semiconductor devices from an ESD pulse. For example, a drain region of the first ESD device is coupled to the I/O structure and a source region of the first ESD device is coupled to the second ESD device. If an ESD pulse is detected at the I/O structure, the first and second ESD devices are turned on such that a majority of the current from the ESD pulse travels through the first and second ESD devices to ground. However, due to the relatively large value of the ESD pulse voltage during the HBM test, the first semiconductor device may be damaged.

For example, during the HBM test, an ESD pulse is applied to the IC and may propagate through the IC (e.g., through the I/O structure) to the gate stack of the first semiconductor device. However, the ESD pulse causes a voltage spike at the gate electrode of the first semiconductor device that may catastrophically damage the first semiconductor device (e.g., "blowing out" the gate dielectric of the first semiconductor device due to a gate-to-source voltage exceeding a threshold voltage), thereby resulting in damage to the IC and failure of the HBM test at the predefined ESD pulse voltage. The voltage spike on the gate stack of the first semiconductor device may catastrophically damage the first semiconductor device because the first and second semiconductor devices share the single body region, such that the voltage difference between the gate electrode of the first semiconductor device and the single body region is greater than a failure voltage of the gate dielectric (e.g., at this location the voltage difference between the gate and body region will cause the gate dielectric to "blow out"). This may mitigate an endurance of the IC and cause the IC to fail the HBM test.

Various embodiments of the present application are directed towards an IC comprising a first semiconductor device and a second semiconductor device (e.g., MOSFETs of an open-drain buffer circuit) that have improved ESD protection. A gate electrode of the first semiconductor device is coupled to an I/O structure, a drain of the first semiconductor device is coupled to an output node of the IC, a source of the first semiconductor device is coupled to a drain of the second semiconductor device, and a source of the second semiconductor device is coupled to a voltage rail. The source and drain of the first semiconductor device are disposed in a first well region, and the source and drain of the second semiconductor device are disposed in a second well region that is laterally offset from the first well region by a non-zero distance. Further, the first and second semiconductor devices are coupled to one another such that the first semiconductor device has a first body contact separate from a second body contact of the second semiconductor device. By virtue of the first and second semiconductor devices being disposed in separate well regions a threshold voltage of the first semiconductor device (e.g., a voltage that would result in "blowing out" of a gate dielectric of the first semiconductor device) is increased. Thus, if an ESD pulse propagates through the IC to the I/O structure and causes a voltage spike at the gate electrode of the first semiconductor device, the voltage spike will be low due to the first body contact being separate from the second body contact. Accordingly, the voltage at the gate electrode of the first semiconductor device may be smaller than the threshold voltage of the first semiconductor device. Therefore, the IC comprising the first and second semiconductor devices has improved (e.g., increased) ESD protection.

FIG. 1 illustrates a circuit diagram 100 of some embodiments of an integrated circuit (IC) comprising a first plurality of semiconductor devices 102a-b and a second plurality of semiconductor devices 104a-b that have improved electrostatic discharge (ESD) performance. In some embodiments, the IC of FIG. 1 may be configured as an input/output (I/O) circuit, an open-drain buffer circuit, or the like.

In some embodiments, the IC comprises the first plurality of semiconductor devices 102a-b, the second plurality of semiconductor devices 104a-b, a first ESD device 103a, a second ESD device 103b, and a resistor 111. In various embodiments, the first plurality of semiconductor devices 102a-b comprises a first p-channel metal-oxide semiconductor (PMOS) device 102a and a second PMOS device 102b, and the second plurality of semiconductor devices 104a-b comprises a first n-channel metal oxide semiconductor (NMOS) devices 104a and a second NMOS device 104b. In further embodiments, the first ESD device 103a and the second ESD device 103b are respectively configured as an NMOS device or another suitable semiconductor device.

An input/output (I/O) terminal 108 is electrically coupled to a gate of the first PMOS device 102a and a gate of the first NMOS device 104a. The resistor 111 is coupled between the I/O terminal 108 and gates of the first PMOS device 102a and the first NMOS device 104a. An input terminal 107 of the first PMOS device 102a and the first NMOS device 104a is between the resistor 111 and the gates of the first PMOS device 102a and the first NMOS device 104a. In some embodiments, the resistor 111 has a resistance of about 100 ohms, about 200 ohms, within a range of about 150 ohms to about 250 ohms, or another suitable value. A drain of the first NMOS device 104a is coupled to an output node 109 and a source of the first NMOS device 104a is coupled to a drain of the second NMOS device 104b. In various embodiments, the output node 109 is coupled to one or more other semiconductor devices (not shown) of the IC (e.g., internal IC logic devices). In various embodiments, a source of the second NMOS device 104b is coupled to a first voltage rail 110 and a gate of the second NMOS device 104b is floating. A drain of the first PMOS device 102a is coupled to the output node 109 and a source of the first PMOS device 102a is coupled to a first node 114. In various embodiments, a drain of the second PMOS device 102b is coupled to the first node 114, a gate electrode of the second PMOS device 102b is floating, and a source of the second PMOS device 102b is coupled to the second node 116. In some embodiments, the second node 116 is coupled to a second voltage rail 112.

In some embodiments, the first ESD device 103a is coupled between the I/O terminal 108 and the first voltage rail 110 and the second ESD device 103b is coupled between the first voltage rail 110 and the second voltage rail 112. The first and second ESD devices 103a-b are configured to mitigate damage to the first and/or second pluralities of semiconductor devices 102a-b, 104a-b from an ESD event. For example, during the ESD event (e.g., during a HBM test) a first ESD pulse 113 (e.g., a positive ESD pulse) is applied to the I/O terminal 108, where there is a first current path 101a across the first plurality of semiconductor devices 102a-b and a second current path 101b across the first and second ESD devices 103a-b. In some embodiments, the second voltage rail 112 is coupled to ground and the first voltage rail 110 is at a higher voltage than the second voltage rail 112 (e.g., at about 0.7 V or greater). After the ESD event is detected, the first and second ESD devices 103a-b are turned on, such that a majority of current from the first ESD pulse 113 traverses the second current path 101b from the I/O terminal 108 to the second voltage rail 112 (e.g., ground). However, at least a portion of the current from the first ESD pulse 113 traverses the first current path 101a across the gate of the first PMOS device 102a, through the second PMOS device 102b to the second voltage rail 112 (e.g., ground).

In various embodiments, the first and second PMOS devices 102a, 102b are disposed in separate well regions (e.g., as illustrated and/or described in FIGS. 2 and 3) and therefore have separate body regions. In such embodiments, the first PMOS device 102a has a first body contact 102ab separate from a second body contact 102bb of the second PMOS device 102b, thereby causing a first voltage drop between the gate electrode of the first PMOS device 102a and the first node 114 and a second voltage drop between the first node 114 and the second node 116 (i.e., across the second PMOS device 102b). Therefore, a voltage spike at the gate electrode of the first PMOS device 102a during the ESD event will be low (e.g., due to the two voltage drops across the first PMOS device 102a and the second PMOS device 102b). Thus, the voltage at the gate electrode of the first PMOS device 102a is smaller than a threshold voltage (e.g., a voltage that would result in "blowing out" of the gate dielectric layer of the first PMOS device 102a). Accordingly, the IC has increased ESD protection and can withstand a relatively large ESD pulse (e.g., an ESD pulse greater than or equal to 2,000 V). In some embodiments, the first body contact 102ab may be configured as and/or referred to as a first well region or first well contact of the first PMOS device 102a. In further embodiments, the second body contact 102bb of the second PMOS device 102b may be configured as and/or referred to as a second well region or second well contact of the second PMOS device 102b.

Figure 4:
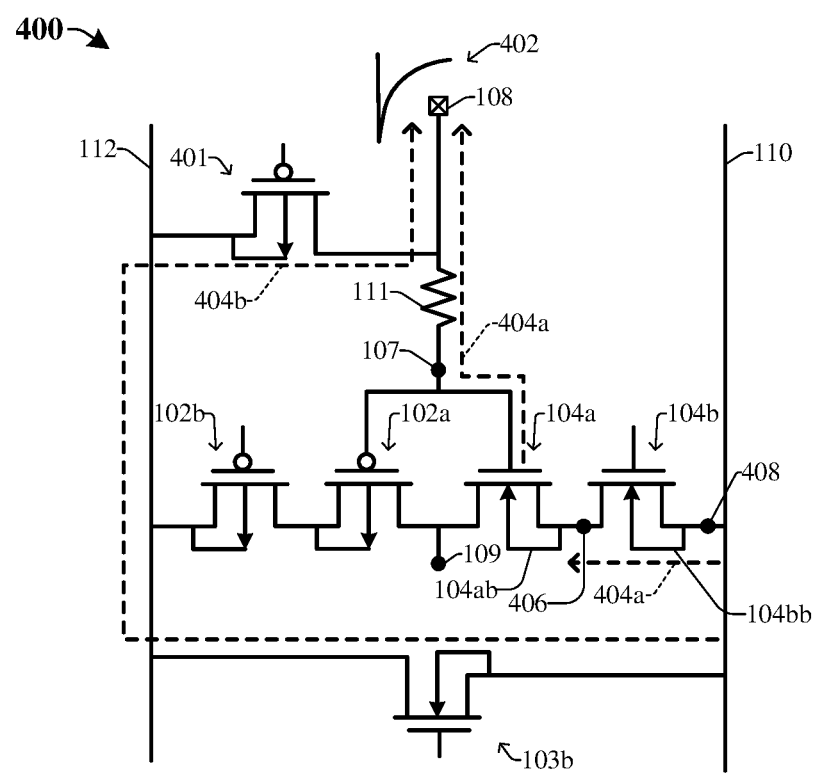
FIG. 4 illustrates a circuit diagram of some other embodiments of the IC of FIG. 1.

Further a human-body model (HBM) test may, for example, be performed when power is removed from the IC, such that power is removed from the first and/or second voltage rails 110, 112. The HBM simulates the static electrical charge transfer from human body to the IC while the IC's power/ground are floating on the first and/or second voltage rails 110, 112. The static electrical charge will randomly enter a pad structure of the IC (e.g., an I/O terminal/pad, a power terminal/pad, a ground terminal/pad, the I/O terminal 108, or another I/O structure of the IC) and then flow to another pad of the IC which is grounded during HBM stress. HBM charge (i.e., an ESD pulse) could be positive (e.g., as illustrated in FIG. 1) or negative (e.g., as illustrated in FIG. 4). In yet further embodiments, when positive charge enters from I/O terminal 108 with second voltage rail 112 grounded (e.g., as illustrated in FIG. 1), the first voltage rail 110 is electrically coupled to a positive voltage.

Figure 2:
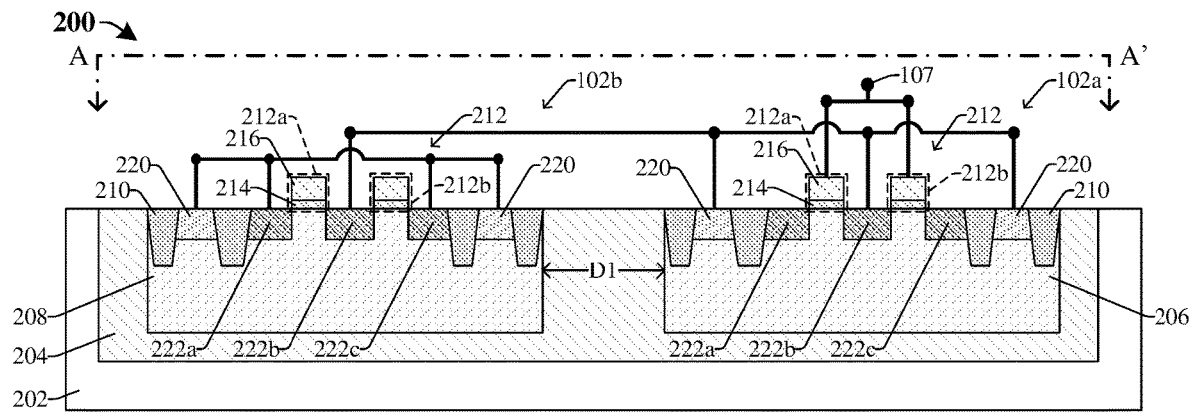
FIG. 2 illustrates a cross-sectional view of some embodiments of an IC comprising a first plurality of semiconductor devices disposed in a plurality of well regions.

FIG. 2 illustrates a cross-sectional view 200 of some embodiments of an IC comprising a first plurality of semiconductor devices 102a, 102b disposed in a plurality of well regions 204-208. An illustrative circuit diagram of the first plurality of semiconductor devices 102a-b can be referred to in FIG. 1 and its corresponding description above.

The IC of FIG. 2 includes a first plurality of semiconductor devices 102a-b disposed on a semiconductor substrate 202. The semiconductor substrate 202 may, for example, be or comprise silicon, monocrystalline silicon, CMOS bulk, germanium, silicon-germanium, gallium arsenide, silicon-on-insulator (SOI), or some other suitable semiconductor body. Further, the semiconductor substrate 202 maybe doped (e.g., with n-type or p-type dopants) or undoped (e.g., intrinsic). In some embodiments, the semiconductor substrate 202 has a first doping type (e.g., p-type).

A plurality of well regions 204-208 is disposed within the semiconductor substrate 202. The plurality of well regions 204-208 comprises a first well region 206, a second well region 208, and a lower well region 204. The lower well region 204 laterally encloses both the first and second well regions 206, 208. In some embodiments, the lower well region 204 comprises the first doping type (e.g., p-type) and the first and second well regions 206, 208 comprise a second doping type (e.g., n-type) that is opposite the first doping type. In some embodiments, the first doping type is p-type and the second doping type is n-type, or vice versa. In various embodiments, the first well region 206 is laterally offset from and/or discrete from the second well region 208. For example, the first well region 206 is a first discrete region of the semiconductor substrate 202 and the second well region 208 is a second discrete region of the semiconductor substrate 202 laterally offset from the first well region 206 by a first distance D1. In some embodiments, the first distance D1 is about 1 micrometer (um), within a range of about 0.5 um to 1.5 um, or another suitable value. By virtue of the first and second well regions 206, 208 being disposed within the lower well region 204 and having an opposite doping type than the lower well region 204, PN-junctions form at an interface between the first and second well regions 206, 208 that facilitate electrical isolation between the first and second well regions 206, 208. In various embodiments, the plurality of well regions 204-208 have a high doping concentration relative to neighboring regions of the semiconductor substrate 202. In further embodiments, the plurality of well regions 204-208 respectively have doping concentration within a range of about $10^{12}$ to $10^{14}$ atoms/cm$^3$, or another suitable value.

An isolation structure 210 is disposed within the semiconductor substrate 202 and comprises multiple segments demarcating a device region for each semiconductor device in the first plurality of semiconductor devices 102a, 102b. The isolation structure 210 is disposed within the first and second well regions 206, 208. Further, the isolation structure 210 may be configured as a shallow trench isolation (STI) structure and may, for example, comprise silicon nitride, silicon carbide, silicon dioxide, another dielectric material, or any combination of the foregoing.

The first plurality of semiconductor devices 102a-b comprises a first PMOS device 102a and a second PMOS device 102b. The first and second PMOS devices 102a, 102b respectively comprise a gate structure 212 disposed on the semiconductor substrate 202, a plurality of source/drain regions 222a-c disposed within the semiconductor substrate 202, and a pick-up region 220. The gate structure 212 comprises a gate dielectric layer 214 disposed on the semiconductor substrate 202 and a gate electrode 216 overlying the gate dielectric layer 214. Further, the gate structure 212 comprises a first gate segment 212a and a second gate segment 212b laterally offset from one another. In various embodiments, the first and second gate segments 212a, 212b continuously extend along a first direction and are arranged in parallel with one another (e.g., see FIG. 3). The gate electrode 216 may, for example, be or comprise polysilicon, aluminum, copper, titanium, tantalum, tungsten, molybdenum, cobalt, another conductive material, or any combination of the foregoing. The gate dielectric layer 214 may, for example, be or comprise an oxide (e.g., silicon dioxide), silicon nitride, a high-k dielectric material such as hafnium oxide, tantalum oxide, aluminum oxide, zirconium oxide, another suitable dielectric material, or any combination of the foregoing.

In some embodiments, the plurality of source/drain regions 222a-c comprises a first source/drain region 222a, a second source/drain region 222b, and a third source/drain region 222c. The first source/drain region 222a is adjacent to a first side of the first gate segment 212a and the second source/drain region 222b is adjacent to a second side of the first gate segment 212a opposite the first side of the first gate segment 212a. The second source/drain region 222b is disposed laterally between the first and second gate segments 212a, 212b and the second source/drain region 222b is adjacent to a first side of the second gate segment 212b. The third source/drain region 222c is adjacent to a second side of the second gate segment 212b opposite the first side of the second gate segment 212b. The first, second, and third source/drain regions 222a, 222b, 222c are each individual and/or discrete doped regions of the semiconductor substrate 202 that continuously extend along the first direction and are arranged in parallel with one another. In some embodiments, the plurality of source/drain regions 222a-c respectively have the first doping type (e.g., p-type) opposite the second doping type (e.g., n-type) of the first and second well regions 206, 208. The plurality of source/drain regions 222a-c respectively have a high doping concentration relative to the plurality of well regions 204-208. In various embodiments, the plurality of source/drain regions 222a-c respectively have doping concentration within a range of about $10^{15}$ to $10^{16}$ atoms/cm$^3$, or another suitable value.

In further embodiments, the pick-up region 220 is ring-shaped and laterally encloses the plurality of source/drain regions 222a-c. The pick-up region 220 comprises the second doping type (e.g., n-type) and is electrically coupled to a corresponding well region. For example, the pick-up region 220 of the first PMOS device 102a is disposed within and electrically coupled to the first well region 206, and the pick-up region 220 of the second PMOS device 102b is disposed within and electrically coupled to the second well region 208. The first well region 206 is configured to receive an independent voltage bias applied to the pick-up region 220 of the first PMOS device 102a that selectively improves electrical properties (e.g., output current, switching speed, leakage current, etc.) of the first PMOS device 102a. Further, the second well region 208 is configured to receive an independent voltage bias applied to the pick-up region 220 of the second PMOS device 102b that selectively improves electrical properties (e.g., output current, switching speed, leakage current, etc.) of the second PMOS device 102b. Segments of the isolation structure 210 are disposed on opposing sides of the pick-up region 220 and separate the pick-up region 220 from the plurality of source/drain regions 222a-c. In various embodiments, the pick-up region 220 has a high doping concentration relative to the first and second well regions 206, 208. In some embodiments, the pick-up region 220 has a doping concentration within a range of about $10^{15}$ to $10^{16}$ atoms/cm$^3$, or another suitable value.

The first, second, and third source/drain regions 222a, 222b, 222c of the first PMOS device 102a are disposed within the first well region 206. In various embodiments, a first source region of the first PMOS device 102a comprises the second source/drain region 222b of the first PMOS device 102a, and a first drain region of the first PMOS device 102a comprises the first and third source/drain regions 222a, 222c of the first PMOS device 102a. Further, the first, second, and third source/drain regions 222a, 222b, 222c of the second PMOS device 102b are disposed within the second well region 208. In some embodiments, a second source region of the second PMOS device 102b comprises the first and third source/drain regions 222a, 222c of the second PMOS device 102b, and a second drain region of the second PMOS device 102b comprises the second source/drain region 222b of the second PMOS device 102b.

The gate electrode 216 of the first PMOS device 102a is electrically coupled to the I/O terminal 108. In various embodiments, the first source region of the first PMOS device 102a (e.g., the second source/drain region 222b of the first PMOS device 102a) is electrically coupled to the pick-up region 220 of the first PMOS device 102a and the second drain region of the second PMOS device 102b (e.g., the second source/drain region 222b of the second PMOS device 102b), thereby defining a first body contact of the first PMOS device 102a. In further embodiments, the second source region of the second PMOS device 102b (e.g., the first and third source/drain regions 222a, 222c of the second PMOS device 102b) is electrically coupled to the pick-up region 220 of the second PMOS device 102b, thereby defining a second body contact of the second PMOS device 102b that is separate from the first body contact of the first PMOS device 102a.

By virtue of the first PMOS device 102a being disposed in the first well region 206 and the second PMOS device 102b being disposed in the second well region 208, where the second well region 208 is laterally offset from the first well region 206 by the first distance D1, an ESD performance of the IC of FIG. 2 is increased. For example, an ESD pulse propagating through the IC may cause a voltage spike at the gate electrode 216 of the first PMOS device 102a. Due to the separation of the first and second well regions 206, 208 and the coupling between the first and second PMOS devices 102a, 102b, the voltage spike at the gate electrode 216 of the first PMOS device 102a is smaller than a threshold voltage (e.g., a voltage that would result in "blowing out" of the gate dielectric layer 214 of the first PMOS device 102a). This, in part, is due to the first body well/contact of the first PMOS device 102a being separate from the second body well/contact of the second PMOS device 102b. Accordingly, ESD protection of the IC is improved (e.g., the IC can withstand an ESD pulse having a voltage greater than or equal to about 2,000 V). Further, the separation of the first and second well regions 206, 208 increases the threshold voltage of the first and second PMOS devices 102a, 102b by at least 15%. Thus, the IC comprising the first and second PMOS devices 102a, 102b may meet or exceed IC specifications for certain specific applications (e.g., HBM ESD class 2 and greater devices that utilize open-drain output pins).

In various embodiments, by virtue of the first distance D1 being relatively large (e.g., greater than about 0.5 um), the first well region 206 remains discrete from the second well region 208 such that out-diffusion of dopants from the first or second well regions 206, 208 (e.g., as a result of high heat during fabrication or operation of the IC) does not result in the first and second well regions 206, 208 contacting one another. In yet further embodiments, by virtue of the first distance D1 being less than about 1.5 um, a lateral footprint of the first and second PMOS devices 102a, 102b is reduced, thereby increasing a number of semiconductor devices that may be disposed within and/or on the semiconductor substrate 202.

Figure 3:
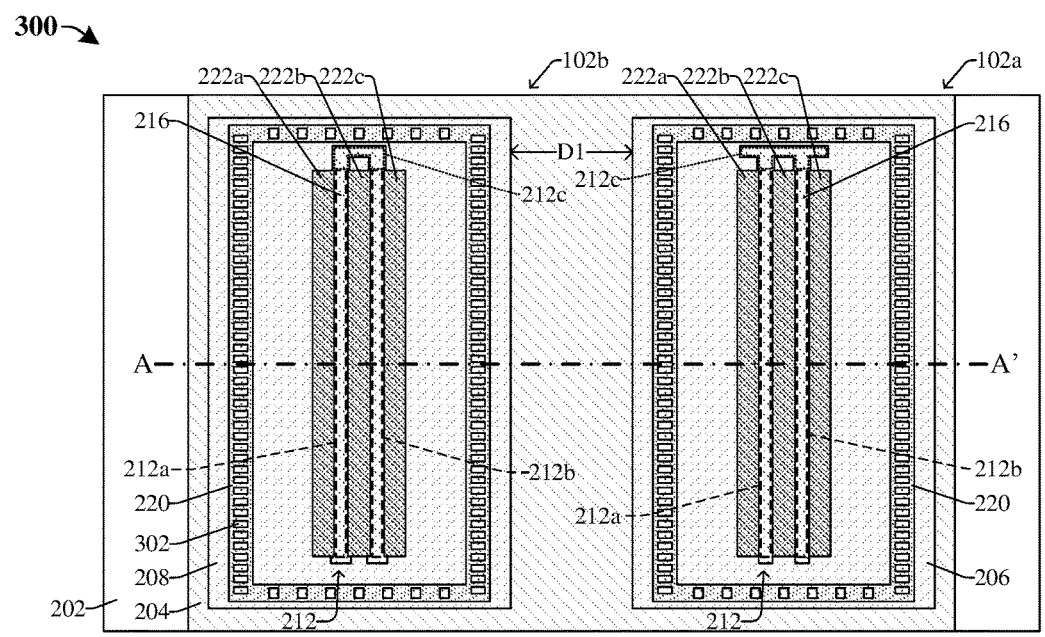
FIG. 3 illustrates a top view of some embodiments of the IC of FIG. 2.

FIG. 3 illustrates a top view 300 of some embodiments of the IC of FIG. 2 taken along the line A-A'. In some embodiments, the cross-sectional view 200 of FIG. 2 is taken along the line A-A' of the top view 300 of FIG. 3. In various embodiments, for ease of illustration, the isolation structure (210 of FIG. 2) is omitted from the top view 300 of FIG. 3.

As illustrated in the top view 300 of FIG. 3, the first well region 206 is laterally offset from the second well region 208 by the first distance D1. Further, the gate structures 212 of the first and second PMOS devices 102a, 102b respectively comprise the first gate segment 212a laterally offset from the second gate segment 212b and a coupling segment 212c that electrically couples the first gate segment 212a to the second gate segment 212b. In some embodiments, the pick-up region 220 is ring-shaped and wraps around corresponding plurality of source/drain regions 222a-c. Further, a plurality of conductive vias 302 overlies the pick-up region 220 and is configured to apply independent voltage bias(es) to the first and/or second well regions 206, 208 by way of the corresponding pick-up region 220. In various embodiments, the lower well region 204 continuously extends around outer perimeters of the first and second well regions 206, 208.

FIG. 4 illustrates a circuit diagram 400 of some embodiments of an IC comprising a first plurality of semiconductor devices 102a-b and a second plurality of semiconductor devices 104a-b that have improved ESD performance. The IC of FIG. 4 may comprise some aspects of the IC of FIG. 1 (and vice versa); and thus, the features and/or reference numerals explained above with regards to FIG. 1 are also applicable to the IC in FIG. 4. Further, in various embodiments, the first plurality of semiconductor devices 102a-b may be configured as illustrated and/or described in FIGS. 2 and 3 and the second plurality of semiconductor devices 104a-b may be configured as illustrated and/or described in FIGS. 5 and 6.

In various embodiments, the circuit diagram 400 of FIG. 4 illustrates an alternative embodiment of the circuit diagram 100 of FIG. 1, in which the IC comprises a third ESD device 401 and a second ESD event is performed on the IC. For example, during the second ESD event a second ESD pulse 402 (e.g., a negative ESD pulse) is applied to the I/O terminal 108, where there is a first current path 404a across the second plurality of semiconductor devices 104a-b and a second current path 404b across the second ESD device 103b and the third ESD device 401. In some embodiments, the first voltage rail 110 is coupled to ground. After the ESD event is detected, the second ESD device 103b and the third ESD device 401 are turned on, such that a majority of current from the second ESD pulse 402 traverses the second current path 404b. In various embodiments, the third ESD device 401 is configured as a PMOS device or another suitable device. Further, the third ESD device 401 is coupled between the I/O terminal 108 and the second voltage rail 112. In yet further embodiments, a first ESD device (e.g., the first ESD device 103a of FIG. 1) is coupled between the first voltage rail 110 and the I/O terminal 108 (not shown).

In various embodiments, the first and second NMOS devices 104a, 104b are disposed in separate well regions (e.g., as illustrated and/or described in FIGS. 5 and 6) and therefore have separate body regions/well regions. In such embodiments, the first NMOS device 104a has a first body contact 104ab separate from a second body contact 104bb of the second NMOS device 104b, thereby causing a first voltage drop between the gate electrode of the first NMOS device 104a and a first node 406 and a second voltage drop between the first node 406 and a second node 408 (i.e., across the second NMOS device 104b). Therefore, a voltage spike at the gate electrode of the first NMOS device 104a during the ESD event will be low (e.g., due to the two voltage drops across the first NMOS device 104a and the second NMOS device 104b). Thus, the voltage at the gate electrode of the first NMOS device 104a is smaller than a threshold voltage (e.g., a voltage that would result in "blowing out" of the gate dielectric layer of the first NMOS device 104a). Accordingly, the IC has increased ESD protection and can withstand a relatively large ESD pulse (e.g., an ESD pulse less than or equal to −2,000 V). In some embodiments, the first body contact 104ab of the first NMOS device 104a may be configured as and/or referred to as a first well region or first well contact of the first NMOS device 104a. In further embodiments, the second body contact 104bb of the second NMOS device 104b may be configured as and/or referred to as a second well region or second well contact of the second NMOS device 104b.

Figure 5:
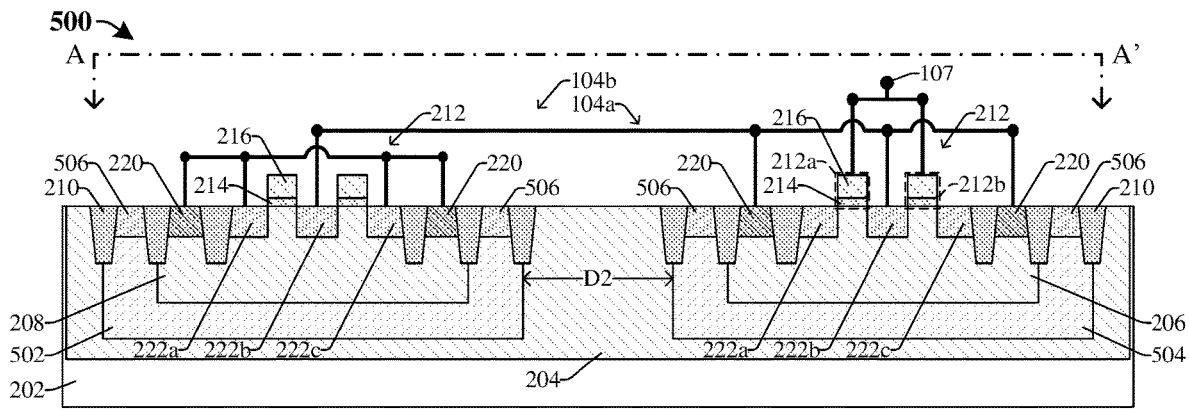
FIG. 5 illustrates a cross-sectional view of some embodiments of an IC comprising a second plurality of semiconductor devices disposed in a plurality of well regions.

FIG. 5 illustrates a cross-sectional view 500 of some embodiments of an IC comprising a second plurality of semiconductor devices 104a-b disposed in a plurality of well regions 204-208, 502-504. An illustrative circuit diagram of the second plurality of semiconductor devices 104a-b can be referred to in FIG. 1 or FIG. 4 and their corresponding description above.

The IC of FIG. 5 includes a second plurality of semiconductor devices 104a-b disposed on a semiconductor substrate 202. In some embodiments, the semiconductor substrate 202 has a first doping type (e.g., p-type). A plurality of well regions 204-208, 502-504 is disposed within the semiconductor substrate 202. The plurality of well regions 204-208, 502-504 comprises a first well region 206, a second well region 208, a lower well region 204, a first isolation well region 502, and a second isolation well region 504. In some embodiments, the first well region 206, the second well region 208, and the lower well region 204 respectively comprise the first doping type (e.g., p-type). In further embodiments, the first isolation well region 502 and the second isolation well region 504 respectively comprise the second doping type (e.g., n-type) opposite the first doping type of the first and second well regions 206, 208.

The first and second isolation well regions 502, 504 are configured to electrically isolate the first well region 206 from the second well region 208. The first isolation well region 502 extends along opposing sides and a bottom of the first well region 206, such that the first isolation well region 502 is disposed between the first well region 206 and the lower well region 204. Further, the second isolation well region 504 extends along opposing sides and a bottom of the second well region 208, such that the second isolation well region 504 is disposed between the second well region 208 and the lower well region 204. The first and second isolation well regions 502, 504 are respectively discrete regions of the semiconductor substrate 202 that are laterally offset from one another by a second distance D2. In some embodiments, the second distance D2 is about 7.5 um, within a range of about 7 um to 8 um, or another suitable value. By virtue of the first and second isolation well regions 502, 504 being disposed around and under the first and second well regions 206, 208 and having the second doping type (e.g., n-type), PN-junctions form at inner and outer perimeters of the first and second isolation well regions 502, 504 that facilitate electrical isolation between the first and second well regions 206, 208.

An isolation structure 210 is disposed within the semiconductor substrate 202 and comprises multiple segments demarcating a device region for each semiconductor device in the second plurality of semiconductor devices 104a-b. The isolation structure 210 is disposed within the first and second well regions 206, 208 and is disposed on opposing sides of the first and second isolation well regions 502, 504.

The second plurality of semiconductor devices 104a-b comprises a first NMOS device 104a and a second NMOS device 104b. The first and second NMOS devices 104a, 104b respectively comprise a gate structure 212 disposed on the semiconductor substrate 202, a plurality of source/drain regions 222a-c disposed within the semiconductor substrate 202, a pick-up region 220, and an isolation contact region 506. The gate structure 212 comprises a gate dielectric layer 214 disposed on the semiconductor substrate 202 and a gate electrode 216 overlying the gate dielectric layer 214. Further, the gate structure 212 comprises a first gate segment 212a and a second gate segment 212b laterally offset from one another.

In some embodiments, the plurality of source/drain regions 222a-c comprises a first source/drain region 222a, a second source/drain region 222b, and a third source/drain region 222c. The first source/drain region 222a is adjacent to a first side of the first gate segment 212a, the second source/drain region 222b is disposed between the first and second gate segments 212a, 212b, and the third source/drain region 222c is adjacent to a first side of the second gate segment 212b. The first, second, and third source/drain regions 222a, 222b, 222c are each individual and/or discrete doped regions of the semiconductor substrate 202 that are arranged in parallel with one another. In some embodiments, the plurality of source/drain regions 222a-c respectively have the second doping type (e.g., n-type) opposite the first doping type (e.g., p-type) of the first and second well regions 206, 208. The plurality of source/drain regions 222a-c respectively have a high doping concentration relative to the plurality of well regions 204-208.

In further embodiments, the pick-up region 220 is ring-shaped and laterally encloses the plurality of source/drain regions 222a-c. In some embodiments, the pick-up region 220 comprises the first doping type (e.g., p-type) and is electrically coupled to a corresponding well region. For example, the pick-up region 220 of the first NMOS device 104a is disposed within and electrically coupled to the first well region 206, and the pick-up region 220 of the second NMOS device 104b is disposed within and electrically coupled to the second well region 208. In various embodiments, the pick-up region 220 has a high doping concentration relative to the first and second well regions 206, 208. The isolation contact region 506 is ring-shaped and laterally encloses a corresponding pick-up region 220. Further, the isolation contact region 506 is disposed in a corresponding one of the first and second isolation well regions 502, 504 and comprises the second doping type (e.g., n-type) with a higher doping concentration than the first and second isolation well regions 502, 504.

The first, second, and third source/drain regions 222a, 222b, 222c of the first NMOS device 104a are disposed within the first well region 206. In various embodiments, a first source region of the first NMOS device 104a comprises the second source/drain region 222b of the first NMOS device 104a, and a first drain region of the first NMOS device 104a comprises the first and third source/drain regions 222a, 222c of the first NMOS device 104a. Further, the first, second, and third source/drain regions 222a, 222b, 222c of the second NMOS device 104b are disposed within the second well region 208. In some embodiments, a second source region of the second NMOS device 104b comprises the first and third source/drain regions 222a, 222c of the second NMOS device 104b, and a second drain region of the second NMOS device 104b comprises the second source/drain region 222b of the second NMOS device 104b.

The gate electrode 216 of the first NMOS device 104a is electrically coupled to the I/O terminal 108. In various embodiments, the first source region of the first NMOS device 104a (e.g., the second source/drain region 222b of the first NMOS device 104a) is electrically coupled to the pick-up region 220 of the first NMOS device 104a and the second drain region of the second NMOS device 104b (e.g., the second source/drain region 222b of the second NMOS device 104b), thereby defining a first body contact of the first NMOS device 104a. In further embodiments, the second source region of the second NMOS device 104b (e.g., the first and third source/drain regions 222a, 222c of the second NMOS device 104b) is electrically coupled to the pick-up region 220 of the second NMOS device 104b, thereby defining a second body contact of the second NMOS device 104b that is separate from the first body contact of the first NMOS device 104a.

By virtue of the first NMOS device 104a being disposed in the first well region 206 and the second NMOS device 104b being disposed in the second well region 208, where the second well region 208 is laterally offset from the first well region 206 by the second distance D2, an ESD performance of the IC of FIG. 5 is increased. For example, an ESD pulse propagating through the IC may cause a voltage spike at the gate electrode 216 of the first NMOS device 104a. Due to the separation of the first and second well regions 206, 208 and the coupling between the first and second NMOS devices 104a, 104b, the voltage spike at the gate electrode 216 of the first NMOS device 104a is smaller than a threshold voltage (e.g., a voltage that would result in "blowing out" of the gate dielectric layer 214 of the first NMOS device 104a). This, in part, is due to the first body contact of the first NMOS device 104a being separate from the second body contact of the second NMOS device 104b. Accordingly, ESD protection of the IC is improved (e.g., the IC can withstand an ESD pulse having a voltage less than or equal to about −2,000 V). Further, the separation of the first and second well regions 206, 208 increases the threshold voltage of the first and second NMOS devices 104a, 104b by at least 16%. Thus, the IC comprising the first and second NMOS devices 104a, 104b may meet or exceed IC specifications for certain specific applications (e.g., HBM ESD class 2 and greater devices that utilize open-drain output pins).

In various embodiments, by virtue of the second distance D2 being relatively large (e.g., greater than about 7 um), the first and second isolation well regions 502, 504 remain isolated and/or discrete from one another such that out-diffusion of dopants from the first and second isolation well regions 502, 504 (e.g., as a result of high heat during fabrication or operation of the IC) does not result in the first and second isolation well regions 502, 504 contacting one another. This, in part, facilitates the first and second well regions 206, 208 remaining separated from one another. In yet further embodiments, by virtue of the second distance D2 being less than about 8 um, a lateral footprint of the first and second NMOS devices 104a, 104b is reduced, thereby increasing a number of semiconductor devices that may be disposed within and/or on the semiconductor substrate 202.

Figure 6:
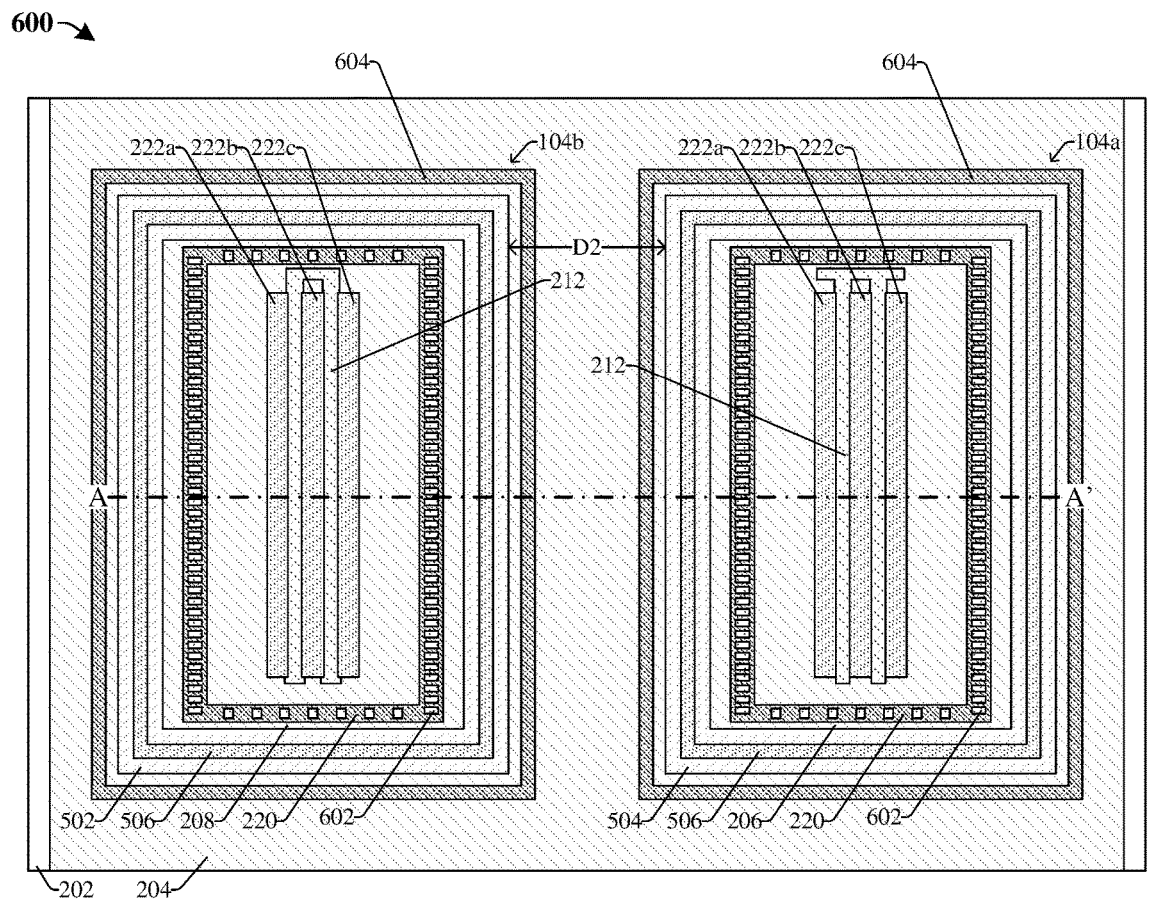
FIG. 6 illustrates a top view of some embodiments of the IC of FIG. 5.

FIG. 6 illustrates a top view 600 of some embodiments of the IC of FIG. 5 taken along the line A-A'. In some embodiments, the cross-sectional view 500 of FIG. 5 is taken along the line A-A' of the top view 600 of FIG. 6. In various embodiments, for ease of illustration, the isolation structure (210 of FIG. 6) is omitted from the top view 600 of FIG. 6. In yet further embodiments, the top view 600 of FIG. 6 further comprises contact regions 604 that are omitted from the cross-sectional view 500 of FIG. 5 for ease of illustration.

As illustrated in the top view 600 of FIG. 6, the first and second isolation well regions 502, 504 are laterally offset from one another by the second distance D2. In some embodiments, the first and second isolation well regions 502, 504 are ring-shaped. Further, a plurality of conductive vias 602 overlies the pick-up region 220 and is configured to apply independent voltage bias(es) to the first and/or second well regions 206, 208 by way of the corresponding pick-up region 220. In addition, the contact regions 604 are ring-shaped and laterally enclose a corresponding one of the first and second isolation well regions 502, 504. The contact regions 604 comprise the first doping type and are configured to apply an independent voltage to the lower well region 204.

Figure 7:
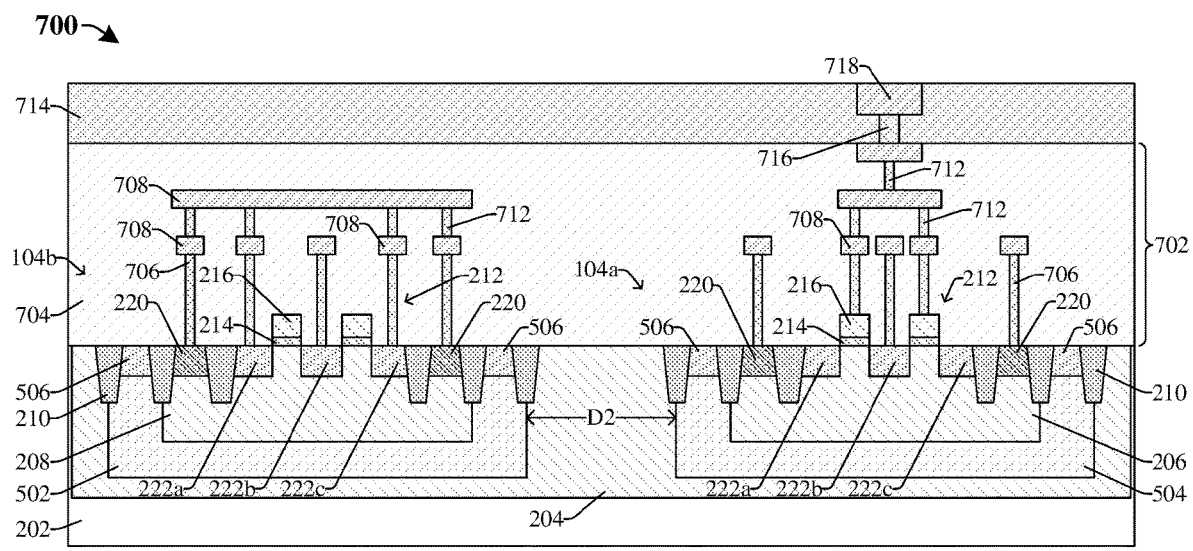
FIG. 7 illustrates a cross-sectional view of some other embodiments of the IC of FIG. 5.

FIG. 7 illustrates a cross-sectional 700 corresponding to some alternative embodiments of the IC of FIG. 5, where an interconnect structure 702 overlies the semiconductor substrate 202 and one or more I/O structures 718 (e.g., bond pads, solder bumps, etc.) overlie the interconnect structure 702.

In various embodiments, the interconnect structure 702 comprises a plurality of conductive contacts 706, a plurality of conductive wires 708, and a plurality of conductive vias 712 disposed within an interconnect dielectric structure 704. The interconnect structure 702 is configured to electrically coupled regions and/or structures of the first and second NMOS devices 104a, 104b to one another. In various embodiments, the interconnect structure 702 is configured to electrically couple the first and second NMOS devices 104a, 104b to one another in a predefined manner, for example, as illustrated and/or described in FIGS. 4 and 5. A passivation layer 714 overlies the interconnect structure 702. One or more upper conductive vias 716 are disposed in the passivation layer 714 and overlies an upper conductive wire in the plurality of conductive wires 708. Further, the one or more I/O structures 718 are disposed in the passivation layer 714 over the one or more upper conductive vias 716. In various embodiments, the one or more I/O structures 718 may be configured as open-drain I/O structures.

FIGS. 8-13 illustrated cross-sectional views 800-1300 of some embodiments of a method for forming an IC comprising a first plurality of semiconductor devices disposed in a plurality of well regions. Although the cross-sectional views 800-1300 shown in FIGS. 8-13 are described with reference to a method, it will be appreciated that the structures shown in FIGS. 8-13 are not limited to the method but rather may stand alone separate of the method. Although FIGS. 8-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 8:
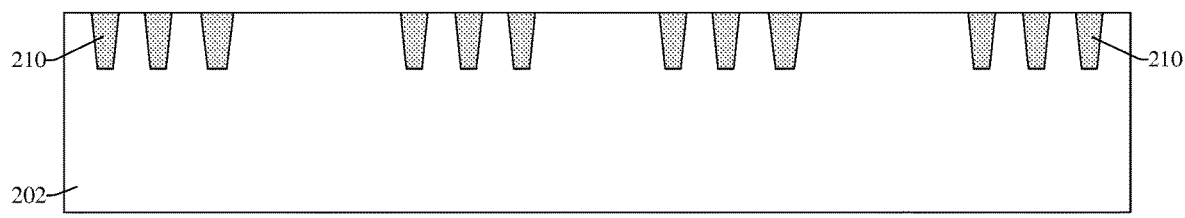
FIGS. 8-13 illustrate a series of cross-sectional views of some embodiments of a method for forming an IC comprising a plurality of semiconductor devices disposed in a plurality of well regions.

As illustrated in cross-sectional view 800 of FIG. 8, a semiconductor substrate 202 is provided and an isolation structure 210 is formed in the semiconductor substrate 202. The semiconductor substrate 202 may, for example, be or comprise silicon, monocrystalline silicon, CMOS bulk, germanium, silicon-germanium, gallium arsenide, silicon-on-insulator (SOI), or some other suitable semiconductor body. In various embodiments, a process for forming the isolation structure 210 may comprise: forming a masking layer (not shown) over a top surface of the semiconductor substrate 202; selectively etching the semiconductor substrate 202 according to the masking layer to form one or more trenches extending into the top surface of the semiconductor substrate 202; filling (e.g., by chemical vapor deposition (CVD), physical vapor deposition (PVD), atomic layer deposition (ALD), thermal oxidation, etc.) the one or more trenches with a dielectric material (e.g., silicon dioxide, silicon nitride, silicon carbide, etc.); and performing a removal process to remove the masking layer. In some embodiments, after filling the one or more trenches with the dielectric material, a planarization process (e.g., a chemical mechanical planarization (CMP) process) may be performed on the dielectric material.

Figure 9:
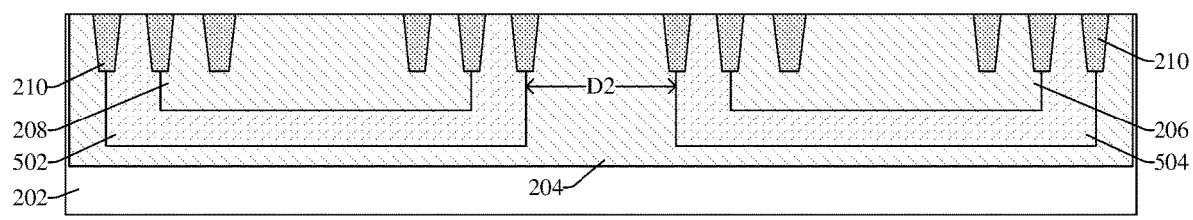

As illustrated in cross-sectional view 900 of FIG. 9, one or more ion implantation processes are performed on the semiconductor substrate 202 to form one or more doped regions within the semiconductor substrate 202. In various embodiments, the one or more ion implantation processes may be performed to form a plurality of well regions 204-208 and 502-504. In some embodiments, the plurality of well regions 204-208, 502-504 comprises a first well region 206, a second well region 208, a lower well region 204, a first isolation well region 502, and a second isolation well region 504. In some embodiments, the one or more ion implantation processes may each include: forming a masking layer (not shown) over the top surface of the semiconductor substrate 202; selectively implanting dopants according to the masking layer into the semiconductor substrate 202; and performing a removal process to remove the masking layer. In yet further embodiments, a first ion implantation process may be performed to form the first well region 206, the second well region 208, and the lower well region 204, and a separate second ion implantation process may be performed to form the first isolation well region 502 and the second isolation well region 504. In some embodiments, the first well region 206, the second well region 208, and the lower well region 204 respectively comprise the first doping type (e.g., p-type), and the first isolation well region 502 and the second isolation well region 504 respectively comprise the second doping type (e.g., n-type) opposite the first doping type of the first and second well regions 206, 208. Further, the first and second isolation well regions 502, 504 are laterally offset from one another by a second distance D2. In various embodiments, the distance D2 is about 7.5 um, within a range of about 7 um to about 8 um, or some other suitable value. In various embodiments, the plurality of well regions 204-208, 502-504 have a layout as illustrated and/or described in the top view 600 of FIG. 6.

In yet further embodiments, the one or more ion implantation process may be performed to form the plurality of well regions 204-208 as illustrated and/or described in FIGS. 2 and 3. In such embodiments, the first and second isolation well regions 502, 504 are omitted and the plurality of well regions 204-208 are formed such that the lower well region 204 laterally encloses both the first and second well regions 206, 208, the lower well region 204 comprises the first doping type (e.g., p-type), and the first and second well regions 206, 208 comprise the second doping type (e.g., n-type).

Figure 10:
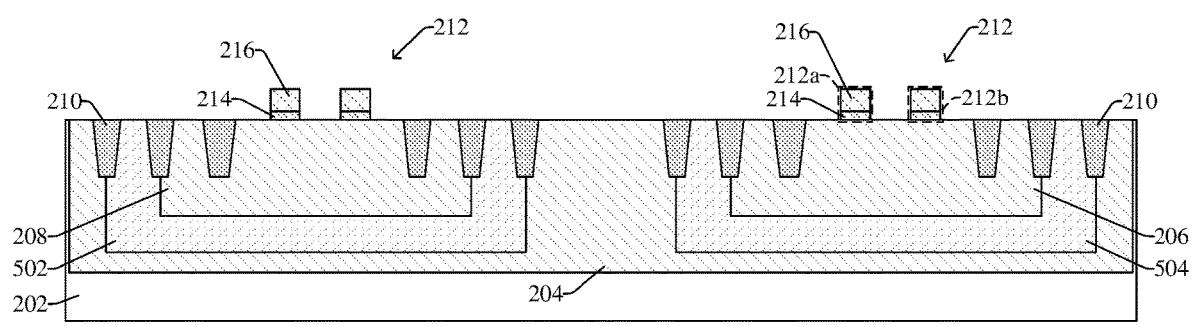

As illustrated in cross-sectional view 1000 of FIG. 10, gate structures 212 are formed over the first well region 206 and the second well region 208. Each gate structure 212 comprises a gate dielectric layer 214 disposed on the semiconductor substrate 202 and a gate electrode 216 overlying the gate dielectric layer 214. Further, the gate structures 212 comprise a first gate segment 212a and a second gate segment 212b laterally offset from one another. In various embodiments, the first and second gate segments 212a, 212b continuously extend along a first direction and are arranged in parallel with one another (e.g., see FIG. 6). In some embodiments, a process for forming the gate structures 212 comprises: depositing (e.g., by CVD, PVD, ALD, thermal oxidation, etc.) a gate dielectric material over the top surface of the semiconductor substrate 202; depositing (e.g., by CVD, PVD, sputtering, electroplating, electroless plating, etc.) a gate electrode material over the gate dielectric material; and patterning the gate dielectric material and the gate electrode material by a masking layer (not shown). The gate electrode 216 may, for example, be or comprise polysilicon, aluminum, copper, titanium, tantalum, tungsten, molybdenum, cobalt, another conductive material, or any combination of the foregoing. The gate dielectric layer 214 may, for example, be or comprise an oxide (e.g., silicon dioxide), silicon nitride, a high-k dielectric material such as hafnium oxide, tantalum oxide, aluminum oxide, zirconium oxide, another suitable dielectric material, or any combination of the foregoing. In some embodiments, the gate structures 212 are formed such that the gate structures 212 have a layout as illustrated in FIG. 3 or FIG. 6.

Figure 11:
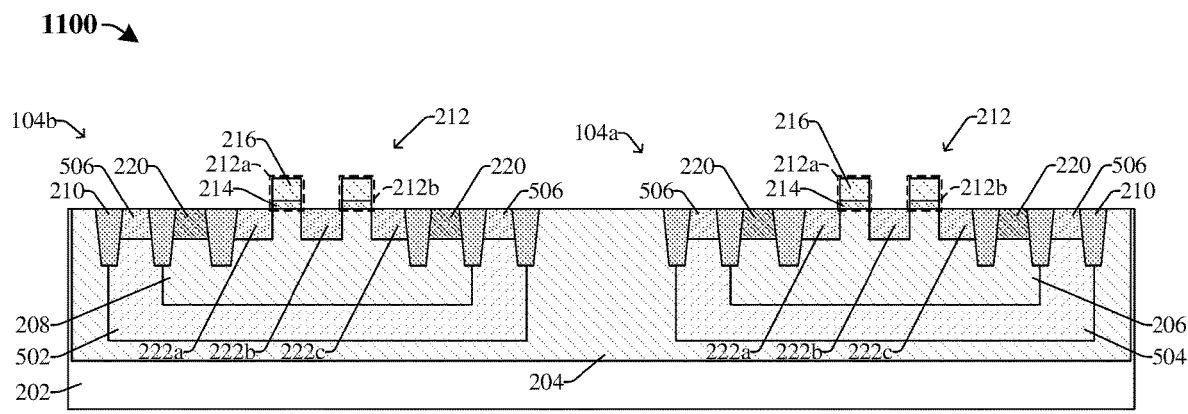

As illustrated in cross-sectional view 1100 of FIG. 11, one or more ion implantation processes are performed on the semiconductor substrate 202 to form doped regions within the semiconductor substrate 202, thereby defining a plurality of semiconductor devices 104a-b on the semiconductor substrate 202. In some embodiments, the one or more ion implantation processes are performed to form a plurality of source/drain regions 222a-c, a pick-up region 220, and an isolation contact region 506. In various embodiments, the one or more ion implantation processes may each include: forming a masking layer (not shown) over the top surface of the semiconductor substrate 202; selectively implanting dopants into the semiconductor substrate 202; and performing a removal process to remove the masking layer. In some embodiments, the plurality of source/drain regions 222a-c have the second doping type opposite the first doping type of the first and second well regions 206, 208, the pick-up region 220 has the first doping type, and the isolation contact region 506 has the second doping type. In yet further embodiments, the one or more ion implantation processes are performed such that the plurality of source/drain regions 222a-c, the pick-up region 220, and the isolation contact region 506 have the layout as illustrated and/or described in FIG. 6.

In yet further embodiments, the one or more ion implantation process may be performed to form the plurality of source/drain regions 222a-c and the pick-up region 220 as illustrated and/or described in FIGS. 2 and 3. In such embodiments, the isolation contact region 506 is omitted, the plurality of source/drain regions 222a-c have the first doping type, and the pick-up region 220 has the second doping type.

Figure 12:
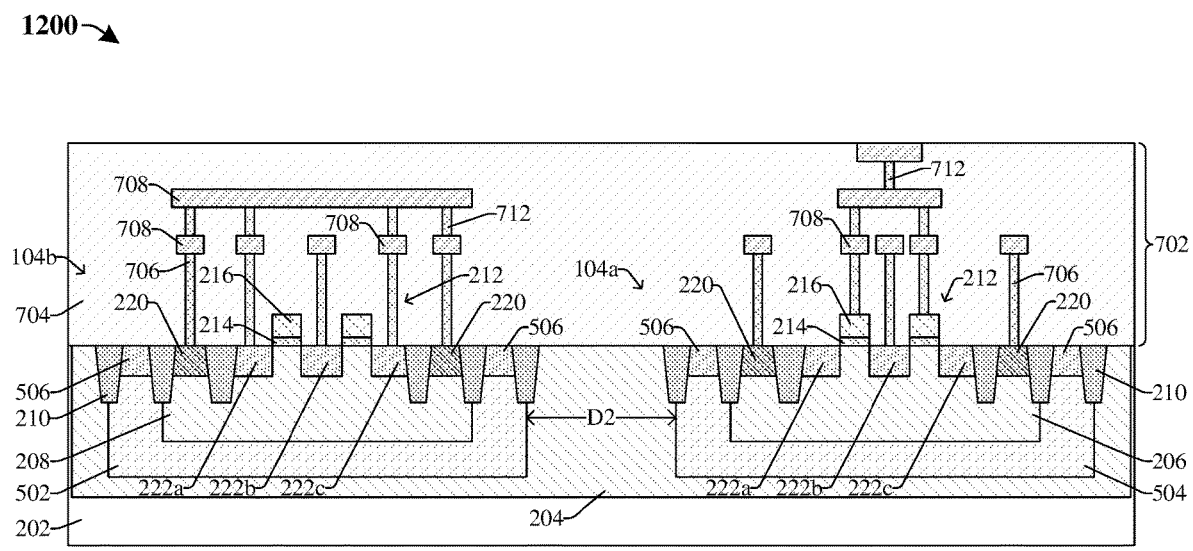

As illustrated in cross-sectional view 1200 of FIG. 12, an interconnect structure 702 is formed over the semiconductor substrate 202. The interconnect structure 702 comprises a plurality of conductive contacts 706, a plurality of conductive wires 708, and a plurality of conductive vias 712 disposed within an interconnect dielectric structure 704. In various embodiments, the interconnect dielectric structure 704 may be formed one or more CVD process(es), PVD process(es), ALD process(es), or the like. Further, the plurality of conductive contacts 706, the plurality of conductive wires 708, and the plurality of conductive vias 712 may be formed by one or more patterning processes, one or more deposition process, and/or some other suitable fabrication processes.

Figure 13:
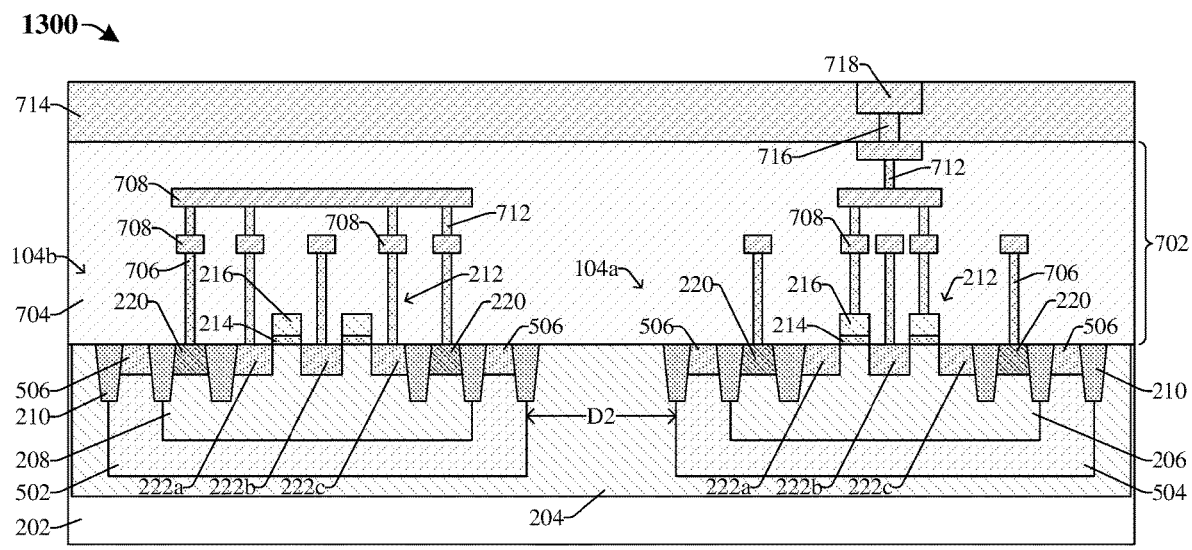

As illustrated in cross-sectional view 1300 of FIG. 13, one or more I/O structures 718, one or more upper conductive vias 716, and a passivation layer 714 are formed over the interconnect structure. In some embodiments, the passivation layer 714 is formed by a CVD process, a PVD process, an ALD process, or the like. Further, the one or more I/O structures 718 and the one or more upper conductive vias 716 may be formed by one or more patterning processes, one or more deposition process, and/or some other suitable fabrication processes.

Figure 14:
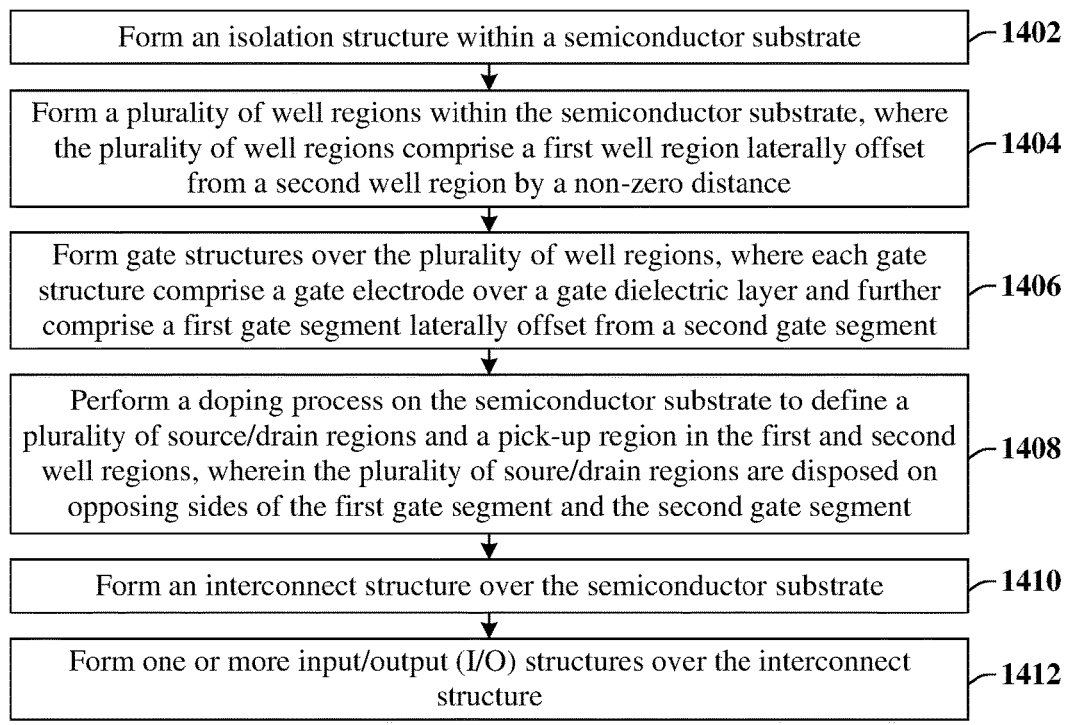
FIG. 14 illustrates some embodiments of a method for forming an IC comprising a plurality of semiconductor devices disposed in a plurality of well regions.

FIG. 14 illustrates some embodiments of a method 1400 for forming an IC comprising a first plurality of semiconductor devices disposed in a plurality of well regions. Although the method 1400 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1402, an isolation structure is formed within a semiconductor substrate. FIG. 8 illustrates a cross-sectional view 800 corresponding to some embodiments of act 1402.

At act 1404, a plurality of well regions is formed within the semiconductor substrate, where the plurality of well regions comprise a first well region laterally offset from a second well region by a non-zero distance. FIG. 9 illustrates a cross-sectional view 900 corresponding to some embodiments of act 1404.

At act 1406, gate structures are formed over the plurality of well regions, where each gate structure comprises a gate electrode over a gate dielectric layer and further comprise a first gate segment laterally offset from a second gate segment. FIG. 10 illustrates a cross-sectional view 1000 corresponding to some embodiments of act 1406.

At act 1408, a doping process is performed on the semiconductor substrate to define a plurality of source/drain regions and a pick-up region in the first and second well regions, where the plurality of source/drain regions are disposed on opposing sides of the first gate segment and the second gate segment. FIG. 11 illustrates a cross-sectional view 1100 corresponding to some embodiments of act 1408.

At act 1410, an interconnect structure is formed over the semiconductor substrate. FIG. 12 illustrates a cross-sectional view 1200 corresponding to some embodiments of act 1410.

At act 1412, one or more input/output (I/O) structures are formed over the interconnect structure. FIG. 13 illustrates a cross-sectional view 1300 corresponding to some embodiments of act 1412.

Accordingly, in some embodiments, the present disclosure relates to an IC having a first semiconductor device disposed in a first well region and a second semiconductor device disposed in a second well region that is laterally offset from the first well region by a non-zero distance.

In some embodiments, the present application provides an integrated circuit (IC) including: a first semiconductor device disposed on a semiconductor substrate, wherein the first semiconductor device comprises a first gate structure, a first source region, and a first drain region, wherein the first source region and the first drain region are disposed in a first well region, wherein the first well region comprises a first doping type and the first source and drain regions comprise a second doping type opposite the first doping type; a second semiconductor device disposed on the semiconductor substrate, wherein the second semiconductor device comprises a second gate structure, a second source region, and a second drain region, wherein the second source region and the second drain region are disposed in a second well region, wherein the second well region comprises the first doping type and the first source and drain regions comprise the second doping type, wherein the first well region is laterally offset from the second well region by a first distance; and a third well region disposed in the semiconductor substrate and laterally between the first and second well regions, wherein the third well region comprises the second doping type.

In some embodiments, the present application provides an integrated circuit (IC) including: a first semiconductor device and a second semiconductor device disposed on a semiconductor substrate, wherein a first source region and a first drain region of the first semiconductor device are disposed within a first well region, wherein a second source region and a second drain region of the second semiconductor device are disposed within a second well region, wherein the first well region and the second well region are disposed within the semiconductor substrate and are laterally offset from one another by a non-zero distance; and a first pick-up region disposed in the first well region, wherein the first pick-up region and the first well region have a first doping type, and wherein the second drain region is directly electrically coupled to the first well region by way of the first pick-up region.

In some embodiments, the present application provides a method for forming an integrated circuit (IC), the method includes: forming an isolation structure within a semiconductor substrate; doping the semiconductor substrate to form a first well region, a second well region, and a lower well region, wherein the first and second well regions have a first doping type, wherein the lower well region is disposed laterally between the first well region and the second well region; forming a first gate structure on the first well region and a second gate structure on the second well region; doping the semiconductor substrate to form a first source region and a first drain region in the first well region and a second source region and a second drain region in the second well region, wherein the first source region, the first drain region, the second source region, and the second drain region have a second doping type opposite the first doping type; doping the semiconductor substrate to form a first pick-up region in the first well region; and forming an interconnect structure over the semiconductor substrate, wherein the interconnect structure comprises conductive wires and vias that directly electrically coupled the first well region to the second source region by way of the first pick-up region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
 a first semiconductor device disposed on a semiconductor substrate, wherein the first semiconductor device comprises a first gate structure, a first source region, and a first drain region, wherein the first source region and the first drain region are disposed in a first well region, wherein the first well region comprises a first doping type and the first source and drain regions comprise a second doping type opposite the first doping type;
 a second semiconductor device disposed on the semiconductor substrate, wherein the second semiconductor device comprises a second gate structure, a second source region, and a second drain region, wherein the second source region and the second drain region are disposed in a second well region, wherein the second well region comprises the first doping type and the second source and drain regions comprise the second doping type, wherein the first well region is laterally offset from the second well region by a first distance; and
 a third well region disposed in the semiconductor substrate and laterally between the first and second well regions, wherein the third well region comprises the second doping type, wherein the third well region continuously laterally extends along the first distance and abuts bottoms of the first well region and the second well region.

2. The IC of claim 1, wherein the first semiconductor device further comprises a first pick-up region disposed in the first well region, wherein the first pick-up region is directly electrically coupled to the first source region and the second drain region.

3. The IC of claim 2, wherein the first pick-up region comprises the first doping type and is ring-shaped.

4. The IC of claim 1, wherein the second semiconductor device further comprises a second pick-up region disposed in the second well region, wherein the second pick-up region is directly electrically coupled to the second source region.

5. The IC of claim 4, wherein the second pick-up region comprises the first doping type and is ring-shaped.

6. The IC of claim 1, wherein the first drain region comprises a first doped region in the first well region and a second doped region in the first well region, wherein the first source region is disposed laterally between the first doped region and the second doped region.

7. The IC of claim 6, wherein the first gate structure comprises a first gate segment and a second gate segment, wherein the first gate segment is spaced between the first doped region and the first source region, and wherein the second gate segment is spaced between the first source region and the second doped region.

8. The IC of claim 6, wherein the second source region comprises a third doped region in the second well region and a fourth doped region in the second well region, wherein the second drain region is disposed laterally between the third doped region and the fourth doped region.

9. An integrated circuit (IC) comprising:
 a first semiconductor device and a second semiconductor device disposed on a semiconductor substrate, wherein a first source region and a first drain region of the first semiconductor device are disposed within a first well region, wherein a second source region and a second drain region of the second semiconductor device are disposed within a second well region, wherein the first well region and the second well region are disposed within the semiconductor substrate and are laterally offset from one another by a non-zero distance; and a first pick-up region disposed in the first well region, wherein the first pick-up region and the first well region have a first doping type, and wherein the second drain region is electrically coupled to the first pick-up region and is electrically coupled to the first well region by way of the first pick-up region.

10. The IC of claim 9, further comprising:
a lower well region disposed within the semiconductor substrate, wherein the lower well region laterally surrounds and directly underlies both the first and second well regions.

11. The IC of claim 10, wherein the lower well region comprises a second doping type opposite the first doping type, wherein the lower well region continuously laterally extends along the non-zero distance.

12. The IC of claim 11, wherein the first semiconductor device and the second semiconductor device are respectively configured as a PMOS device.

13. The IC of claim 10, further comprising:
a first isolation well region disposed between the first well region and the lower well region; and
a second isolation well region disposed between the second well region and the lower well region;
wherein the first and second isolation well regions have a second doping type opposite the first doping type, wherein the lower well region comprises the first doping type.

14. The IC of claim 13, further comprising:
a first isolation contact region disposed within the first isolation well region, wherein the first isolation contact region is ring-shaped and laterally encloses the first pick-up region.

15. The IC of claim 13, wherein the first semiconductor device and the second semiconductor device are respectively configured as an NMOS device.

16. A method for forming an integrated circuit (IC), the method comprising:
forming an isolation structure within a semiconductor substrate;
doping the semiconductor substrate to form a first well region, a second well region, and a lower well region, wherein the first and second well regions have a first doping type, wherein the lower well region is disposed laterally between the first well region and the second well region;
forming a first gate structure on the first well region and a second gate structure on the second well region;
doping the semiconductor substrate to form a first source region and a first drain region in the first well region and a second source region and a second drain region in the second well region, wherein the first source region, the first drain region, the second source region, and the second drain region have a second doping type opposite the first doping type;
doping the semiconductor substrate to form a first pick-up region in the first well region; and
forming an interconnect structure over the semiconductor substrate, wherein the interconnect structure comprises conductive wires and vias that electrically couple the first well region to the second drain region by way of the first pick-up region.

17. The method of claim 16, wherein the lower well region has the second doping type and abuts sides of the first well region and sides of the second well region.

18. The method of claim 16, further comprising:
doping the semiconductor substrate to from a first isolation well region and a second isolation well region, wherein the first isolation well region is disposed between the first well region and the lower well region, and wherein the second isolation well region is disposed between the second well region and the lower well region.

19. The method of claim 18, wherein the first and second isolation well regions have the second doping type and the lower well region has the first doping type.

20. The method of claim 16, wherein the first pick-up region is ring-shaped and laterally encloses the first source region and the first drain region.

* * * * *